US00RE50173E

(19) United States
(12) Reissued Patent
Santiquet et al.

(10) Patent Number: US RE50,173 E
(45) Date of Reissued Patent: Oct. 15, 2024

(54) METHOD AND SYSTEM FOR DYNAMICALLY MANIPULATING AN ASSEMBLY OF OBJECTS IN A THREE-DIMENSIONAL SCENE OF A SYSTEM OF COMPUTER-AIDED DESIGN

(71) Applicant: Dassault Systemes, Velizy Villacoublay (FR)

(72) Inventors: Laurent Santiquet, Bouc-Bel-Air (FR); Bertrand Faure, Meudon la Foret (FR)

(73) Assignee: Dassault Systemes, Velizy Villacoublay (FR)

(21) Appl. No.: 16/826,878

(22) Filed: Mar. 23, 2020

Related U.S. Patent Documents

Reissue of:
(64) Patent No.: 9,953,108
Issued: Apr. 24, 2018
Appl. No.: 13/906,052
Filed: May 30, 2013

(30) Foreign Application Priority Data

Jun. 7, 2012 (EP) ..... 12305654

(51) Int. Cl.
*G06F 3/0484* (2022.01)
*G06F 3/04847* (2022.01)
(Continued)

(52) U.S. Cl.
CPC ..... *G06F 30/12* (2020.01); *G06F 3/04847* (2013.01); *G06F 30/00* (2020.01);
(Continued)

(58) Field of Classification Search
CPC .. G06F 17/50; G06F 3/04847; G06F 17/5009; G06F 30/10; G06F 30/12;
(Continued)

(56) References Cited

U.S. PATENT DOCUMENTS 6,061,062 A 5/2000 Venolia ..... G06F 3/0481 715/856
6,556,783 B1 * 4/2003 Gelphman ..... 396/20
(Continued)

FOREIGN PATENT DOCUMENTS

CN 101375239 A 2/2009
EP 2672456 A1 * 12/2013 ..... G06F 17/50
(Continued)

OTHER PUBLICATIONS

Enovia DMU Solution Version 5 Release 15 (DMU Infrastructure User's Guide); vol. 6 of 6, SK3T-0574-11, [CD-ROM], pp. 323-365; May 31, 2005.
(Continued)

*Primary Examiner* — Luke S Wassum
(74) *Attorney, Agent, or Firm* — Hamilton, Brook, Smith & Reynolds, P.C.

(57) ABSTRACT

A computer-implemented method and system of computer-aided design products for dynamically manipulating an assembly of objects in a three-dimensional scene. The system and method provide the assembly of objects with information relative to kinematic joints linking objects of the assembly. The system and method provide a dynamic manipulating tool (DM) embedded in the scene. The DM tool includes a reference with three-axes allowing for each axis a degree of freedom in translation and a degree of freedom in rotation. Next the system and method attach said dynamic manipulating tool (DM) to one object of the assembly, and select a degree of freedom of the dynamic manipulating tool (DM) attached to the object of the assembly. The system/method apply a load according to said selected degree of freedom and calculates and displays in real-time the result of a dynamic simulation of said load applying.

4 Claims, 14 Drawing Sheets

(51) Int. Cl.

| | |
|---|---|
| ***G06F 30/00*** | (2020.01) |
| ***G06F 30/12*** | (2020.01) |
| ***G06F 30/20*** | (2020.01) |
| ***G06T 19/00*** | (2011.01) |

(52) U.S. Cl.
CPC ..... *G06F 30/20* (2020.01); *G06T 19/00* (2013.01); *G06T 2200/24* (2013.01)

(58) Field of Classification Search
CPC ..... G06F 30/13; G06F 30/15; G06F 30/17; G06F 30/20; G06F 30/00; G06T 19/00; G06T 2200/24
See application file for complete search history.

(56) References Cited

U.S. PATENT DOCUMENTS

| | | | | |
|---|---|---|---|---|
| 6,597,382 | B1 | 7/2003 | Charles et al. | |
| 6,963,824 | B1 * | 11/2005 | Davidson et al. | 703/2 |
| 7,823,085 | B2 | 10/2010 | Charles et al. | G06T 19/20 715/850 |
| 7,934,169 | B2 | 4/2011 | Reponen | |
| 8,554,521 | B2 * | 10/2013 | Diguet et al. | 703/1 |
| 9,953,108 | B2 * | 4/2018 | Santiquet | G06F 30/12 |
| 2002/0123812 | A1 * | 9/2002 | Jayaram et al. | 700/98 |
| 2003/0187532 | A1 * | 10/2003 | Charles et al. | G06F 3/04815 706/45 |
| 2005/0204312 | A1 | 9/2005 | Rosel | |
| 2008/0243456 | A1 | 10/2008 | Hudetz et al. | |
| 2009/0248369 | A1 | 10/2009 | Debono et al. | G06F 30/00 703/1 |
| 2013/0332119 | A1 | 12/2013 | Santiquet et al. | |

FOREIGN PATENT DOCUMENTS

| | | |
|---|---|---|
| JP | 2001-056872 | 2/2001 |
| JP | 2006-019914 | 6/2004 |
| JP | 2009-116581 | 11/2007 |

OTHER PUBLICATIONS

Search Report by Registered Searching Organization for Japanese Application No. 2013-120909, entitled, "Liquid Injection Head, Liquid Injection Apparatus, And Piezoelectric Element," Date Mailed: Jun. 6, 2017.

Notification of Reasons for Refusal for Japanese Application No. 2013-120909, entitled, "Liquid Injection Head, Liquid Injection Apparatus, And Piezoelectric Element," Date Mailed: Jul. 4, 2017.

Kayabasi, O., et al., "Static, dynamic and fatigue behaviors of dental implant using finite element method." Advances in engineering software 37.1 O (2006): 649-658.

Kayabaşi, Oğuz, Emir Yüzbasioğlu, and Fehmi Erzincanli. "Static, dynamic and fatigue behaviors of dental implant using finite element method." Advances in engineering software 37.10 (2006):649-658.*

European Search Report dated Jan. 9, 2013 from International Application No. 12305654.1 filed Jun. 7, 2012.

Narayan et al., "Computer Aided Design and Manufacturing.", PHI Learning Pvt. Ltd., 2008, Sections 1.1-1.3, 1.5-1.5.2, 1.6, 5-5.1.1 and 5.3.3-5.4.; XP 055234644.

* cited by examiner

METHOD AND SYSTEM FOR DYNAMICALLY MANIPULATING AN ASSEMBLY OF OBJECTS IN A THREE-DIMENSIONAL SCENE OF A SYSTEM OF COMPUTER-AIDED DESIGN

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATION(S)

This [application] *is an application for reissue of U.S. Pat. No. 9,953,108, which issued from U.S. patent application Ser. No. 13/906,052 which* claims priority under 35 U.S.C. § 119 or 365 to European Application No. 12305654.1, filed Jun. 7, 2012. The entire teachings of the above application(s) are incorporated herein by reference.

FIELD OF THE INVENTION

The invention relates to the field of computers programs and systems, and more specifically to the field of designing of an assembly of objects in a Computer-Aided Design application.

BACKGROUND OF THE INVENTION

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional or 3D models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects; the typical size of a file representing an object in a CAD system being in the range of one Megabyte per part, and an assembly may comprise thousands of parts. A CAD system manages models of objects, which are stored in electronic files.

In computer-aided techniques, the graphical user interface GUI plays an important role as regards the efficiency of the technique. Most of the operations required for manipulating and/or navigating the modeled objects may be performed by the user (e.g. the designer) through the GUI. Especially, the user may create, modify, and delete the modeled objects forming the product, and also explore the product so as to comprehend how modeled objects are interrelated, e.g. via a product structure. Traditionally, these operations are carried out through dedicated menus and icons which are located on the sides of the GUI. Recently, CAD systems such as CATIA allow calling these operations nearby the representation of the product. The designer does not need anymore to move the mouse towards menus and icons. Operations are thus available within reach of the mouse. In addition, the operations behave semantically: for a given operation selected by the designer, the CAD system may suggest to the designer, still nearby the mouse, a set of new operations according to the former selected operation that the designer is likely to select.

Until recent years, some computer software used, for example in automotive and aerospace industry, are based on geometry, for mechanical engineers to be able to see their work in space or in a three-dimensional displaying.

In this domain, computer softwares like CATIA, allow design geometry in a three dimensions space. Such menus and toolbars contain a set of user-selectable icons, each icon being associated with one or more operations or functions. Some of these icons are associated with software tools, adapted for editing and/or working on a 3D geometrical modeled products or parts of products such as that displayed in the graphical user interfaces GUI. In the following description, terms "product", "part", "assembly" and the like may be referred to as "part" for the sake of simplicity. The concept of "part" can also be generalized to that of "object". An object encompasses any constituent of the final digital mock-up, for instance, considering an assembly, an object of this assembly can be a sub-assembly, a part, a kinematic joint, a material, the embedded software executed on an Electronic Control Unit (ECU), or any object needed to describe the entire environment of the assembly, like the modeling of the atmosphere in the case you want to study an airplane flying capacities.

It is known to configure kinematic links to simulate, regardless of the physical laws of dynamic forces, but not in a real-time manner, or, in other words not dynamically.

The kinematic joint definition of an assembly is the set of all kinematic joints between the parts of this assembly.

If certain compatibility rules are satisfied between all joints, a kinematic solver can compute the possible position of parts and shows this as an animation. But this animation will not take into account the physical rules of energy conservation and in the example of a pendulum will not show the balancing effect due to gravity.

It is equally known, in video games, using dynamic interaction for years but in gaming the animation must seem realistic to ensure a high level of interactivity with the player. But the physical values of speed and acceleration, although realistic are not exact. In gaming, the player interacts with the model without monitoring the efforts applied on controls. Even when a force feedback joystick is used, the feedbacks only gives an impression of what it would take in real life to move the model, but no numerical value can be used there, because no real calculate is made. In gaming, the program is a compilation of a plurality of scenarios that cannot be changed, and only seem realistic, but are not.

It is equally known to configure kinematic links to simulate, taking into account the physical laws of dynamic forces, but after calculation, thus not in real-time, and thus not with dynamic interactions with the user.

SUMMARY OF THE INVENTION

A goal of the invention is to provide a computer-implemented method and a system for dynamically manipulating an assembly of objects in a three-dimensional scene of a system of computer-aided design, taking into account dynamically, or, in other words in real-time the physical laws of dynamic forces, like gravity and load (force, torque).

It is proposed, according to one aspect of the invention, a computer-implemented method for dynamically manipulating an assembly of objects in a three-dimensional scene of a system of computer-aided design, the method comprising the steps of:

providing the assembly of objects with information relative to kinematic joints linking objects of the assembly;

providing a dynamic manipulating tool embedded in the scene, comprising a referential with three-[axis]*axes* allowing for each axis a degree of freedom in translation and a degree of freedom in rotation;

attaching said dynamic manipulating tool to one object of the assembly;

selecting a degree of freedom of the dynamic manipulating tool attached to the object of the assembly;

*selecting if the axes of the dynamic manipulating tool rotate with the one object of the assembly to which the dynamic manipulating tool is attached;*

*performing a movement using a mouse with a pressed button or with a contact of a finger on a screen display;*

*converting the performed movement into a load value indicative of a load, the load being a force or a torque, said conversion taking into account a speed for a movement of translation according to an axis or an acceleration for a movement of rotation according to an axis;* applying [a] *the* load [according to said selected degree of freedom] *to the one object, the load having said load value and the direction of the axis of the selected degree of freedom, said direction keeping either a fixed orientation in a world reference frame or rotating with the one object according to said selecting if the axes of the dynamic tool rotate with the one object of the assembly to which the dynamic manipulating tool is attached*;

calculating in real-time and displaying *on the screen display* in real-time [the result] *physical effects* of a dynamic simulation of said load applying *to the assembly of objects, in furtherance of designing the product;*

*wherein said applying the load is performed during the dynamic simulation based on real-time user interactions with the dynamic manipulating tool and wherein during said calculating and displaying in real-time the physical effects of a dynamic simulation, the dynamic manipulating tool follows the part of said one object of the assembly to which it is attached.*

Such a dynamic manipulating tool is described in the document U.S. Pat. No. 7,823,085 B2.

Such a method allows to take into account dynamically, or, in other words in real-time the physical laws of dynamic forces, like gravity and load (force, torque).

Thus the method increases the realism of simulation and observe natural effects, avoiding impossible configuration: kinematic can find positions of an assembly that are mathematically possible but not physically reachable.

According to an embodiment, the step of applying a load according to said selected degree of freedom comprises:

a first sub-step of selecting a range of load values; and a second sub-step of determining a load value among said range.

Thus it is easy for the user to dynamically determine the load to apply to the assembly of objects.

According to an embodiment, the step of applying a load according to said selected degree of freedom comprises a third sub-step of determining a referential in which the load is applied.

Determining a referential from which the load is applied allows to define relatively to which part the load is applied. If the part is not specified, then a referential called "world" is set.

According to an embodiment, the step of applying a load according to said selected degree of freedom comprises a fourth sub-step of determining if the three-axis of the dynamic manipulating tool rotates or not with the object on which the dynamic manipulating tool is attached.

Determining if the three-axis of the dynamic manipulating tool rotates or not with the object on which the dynamic manipulating tool is attached is used only when the referential of the load is the world referential. If the user wants to apply a load in a constant direction (like a far away attraction), the manipulator should not rotate with the object. If the load should be applied in a local axis (to spin a motor axel for example), the user sets the manipulator to turn with the object.

If the referential of the load is not the world referential, but another part of the assembly, then, for simplicity reason, the manipulator should always turn with the part.

These two choices (referential and rotation of manipulator) are necessary to cover the scientific description of a load applied to a solid. The load must be described in a referential (theorem of action/reaction) and with the axis system to express it. The axis system is the manipulator.

According to an embodiment, the step of applying a load is executed by performing a movement of the dynamic manipulating tool, the movement of the tool being converted into a load value.

Thus, the user can manipulate the selected part with a mouse like he would do with a joystick in a video game for example.

According to an embodiment, said conversion takes into account a speed for a movement of translation according to an axis or an acceleration for a movement of rotation according to an axis or a combination of acceleration and speed to drive both rotation and translation.

Such a conversion allows a dynamic manipulation of objects as close as possible to real life feelings:

for rotation: real life feeling is "a short, but accelerating impulse motion on a rotating part increases its rotation speed by application of a torque". This statement corresponds to the physically correct statement because friction in rotation is usually minimized in real life assemblies by mean of special devices like ball bearings for example.

for translation: real life feeling is "pushing an object with high velocity applies a strong load on it". Although not theoretically correct, this statement corresponds to human feeling of friction that is observed in almost all translation motions.

A more sophisticated combination of acceleration and speed can be used to drive both translation and rotation motion.

According to an embodiment, the movement of the dynamic manipulating tool is performed with a mouse with a pressed button or with a contact of a finger on a screen of displaying.

Thus it is very easy for the user to apply a load.

For example, said movement with a mouse or a finger is applied at a distance of the dynamic manipulating tool.

Thus it is possible to apply the load at the right place with keeping a good visibility on the screen because manipulation occurs on interactors but not directly on the manipulator as explained further in this document.

Alternatively, the step of applying a load is executed by directly supplying a value of the load.

According to the case, it can be an easiest way to apply a load for the user.

The load can be a force or a torque.

It is proposed, according to another aspect of the invention, a computer-readable medium having computer-executable instructions to cause the computer system to perform the method for dynamically manipulating an assembly of objects in a three-dimensional scene of a system of computer-aided design as described above.

It is proposed, according to another aspect of the invention, a computer program product, stored on a computer readable medium, for dynamically manipulating an assembly of objects in a three-dimensional scene of a system of computer-aided design, comprising code means for causing the system to take the steps as described above.

It is proposed, according to another aspect of the invention, an apparatus for dynamically manipulating an assembly of objects in a three-dimensional scene of a system of computer-aided design comprising means for implementing the steps of the method as described above.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The invention will be better understood with the study of some embodiments described by way of non-limiting examples and illustrated by the accompanying drawings wherein.

DETAILED DESCRIPTION OF THE INVENTION

A description of example embodiments of the invention follows.

The teachings of all patents, published applications and references cited herein are incorporated by reference in their entirety.

The steps of the present method can be performed by one or more programmable processors executing a computer program to perform functions of the invention by operating on input data and generating output.

A computer program can be written in any form of programming language, including compiled or interpreted languages, and the computer program can be deployed in any form, including as a stand-alone program or as a subroutine, element or other unit suitable for use in a computing environment. A computer program can be deployed to be executed on one computer or on multiple computers at one site or distributed across multiple sites and interconnected by a communication network.

Following figures explain more in details the functioning of the present invention.

On FIGS. 1 to 7 is illustrated a basic use case of the present invention.

Figure 1:
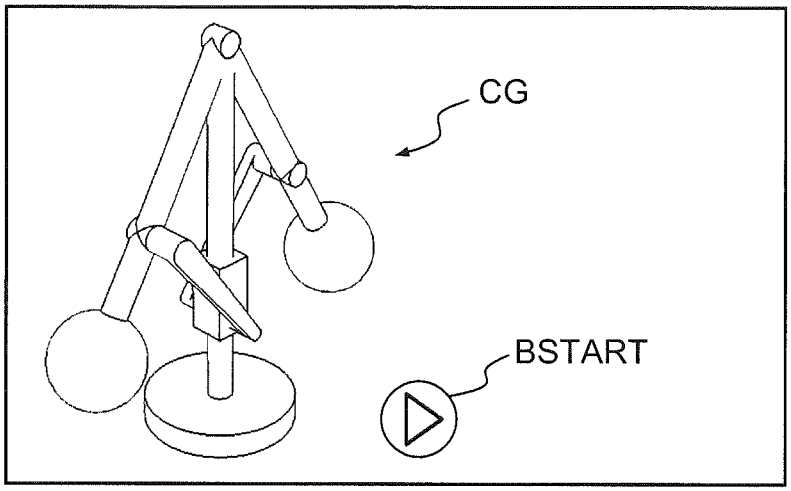
FIGS. 1 to 7 illustrate an example of dynamically manipulating an assembly of objects in a three-dimensional scene of a system of computer-aided design, in a basic use case, according to an aspect of the invention.

On FIG. 1, the method starts with a 3D model or assembly of objects stopped or immobile. On this example the assembly of objects or 3D model is a centrifugal "fly ball" governor CG whose rotation of the mast would spread apart the two spheres of the assembly until the maximum distance between them is reached.

In a step 1, a dynamic simulation is started by pressing on a displayed button BSTART as illustrated on FIG. 1.

Figure 2:
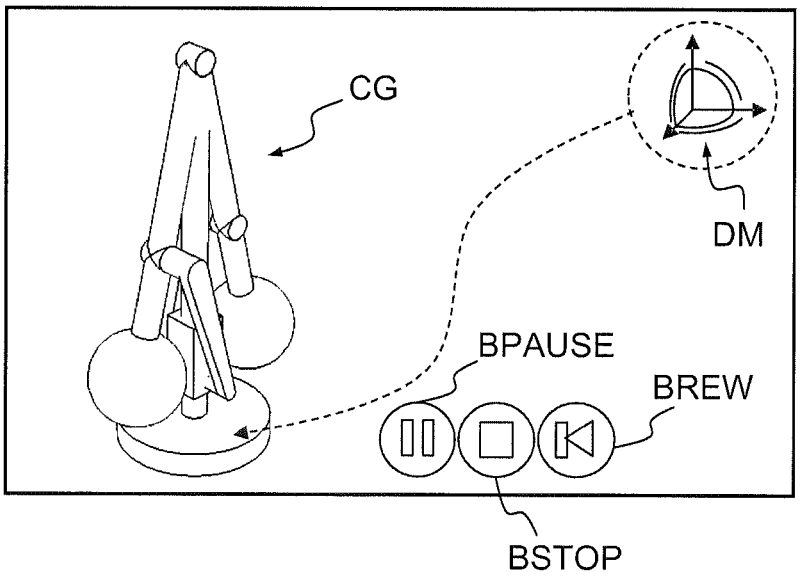

The displayed result is represented on FIG. 2, wherein the arms of the assembly fall down because of the effect of gravity. A dynamic manipulator DM, and a pause button BPAUSE, a stop button BSTOP, and a rewind button BREW appear. The pause button BPAUSE, the stop button BSTOP, and the rewind button are respectively adapted to suspend, stop, and rewind the dynamic simulation.

Like in known systems only taking into account kinematic links, the usual way of interaction is a 3D manipulator, and in the present invention a dynamic 3D manipulator DM.

A manipulator is a graphical artifact controllable by a mouse (cf U.S. Pat. No. 7,823,085) or with a finger on a touch screen. It's positioned on a part and suggests different ways of manipulation. The dynamic manipulator DM is composed of an axis system with three orthogonal axes and three arcs of circle offering different directions of manipulation: three translations along each of the three axis directions, and three rotations along the three arcs or, in other words, around the three axis. In brief, the dynamic manipulator DM comprises and offers six degrees of freedom.

An interaction on an axis would translate the part on which the manipulator is placed, and an interaction on an arc would turn the part on which the manipulator is placed. As dynamic manipulation is running, this manipulation can turn and translate the part of the assembly on which it is placed taking into account physical laws of motion: it's a dynamic manipulator. The character dynamic of the manipulator is illustrated by double arcs of circle.

Thus in a step 2, the user can make a drag and drop of the dynamic manipulator DM on the part of the assembly where the user wants to apply the load.

Figure 3:
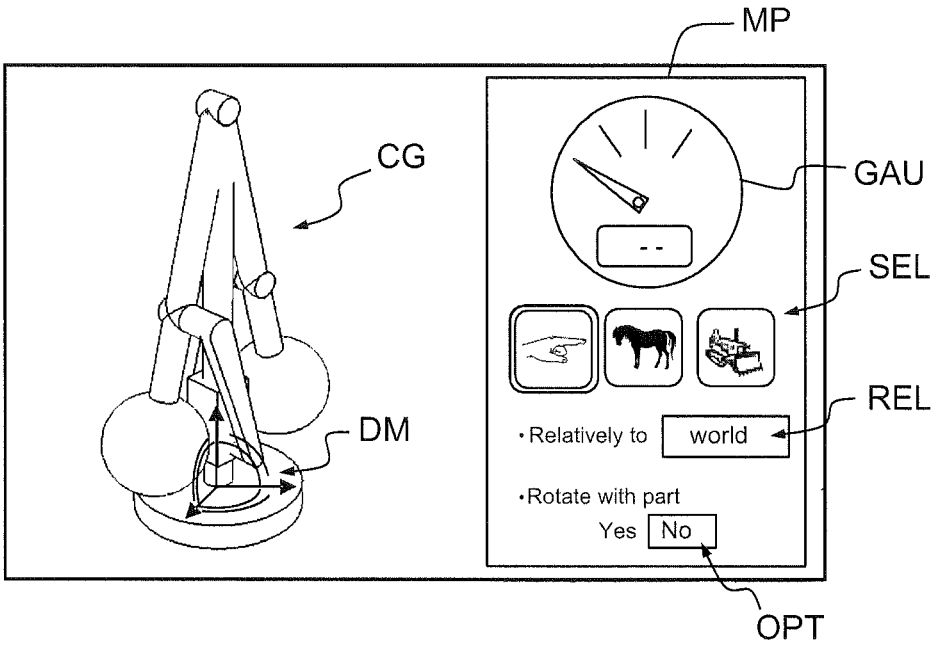

The displayed result is represented on FIG. 3, wherein the user can select one of the six possible manipulation along one of the six degrees of freedom (the three translations and the three rotations). Thus a manipulator panel MP is displayed. The manipulator panel MP comprises a gauge GAU to monitor the load applied, and a selector SEL of level of strength, for example with three icons, each representative of a range of strength. In the present example, three icons are represented, a first icon with a hand, representative of 0.1 to 1 N.m for a torque, and 0.1 to 1 N for a force, a second icon with a horse, representative of 1 to 103 N.m for a torque and 1 to 103 N for a force, and a third icon with a bulldozer, representative of 1 to 106 N.m for a torque and 1 to 106 N for a force.

Furthermore, the manipulator panel MP comprises a field REL to explain relatively to what or to which reference frame or referential the load is applied (world or part of the assembly), and an option OPT to rotate or not the dynamic manipulator DM, or, in other word, to rotate the three axis with the part of the assembly or to keep constant their orientation in space.

Thus in a step 3, the user selects one of the six possible manipulation along one of the six degrees of freedom. In the present example user selects rotation along Z axis.

Figure 4:
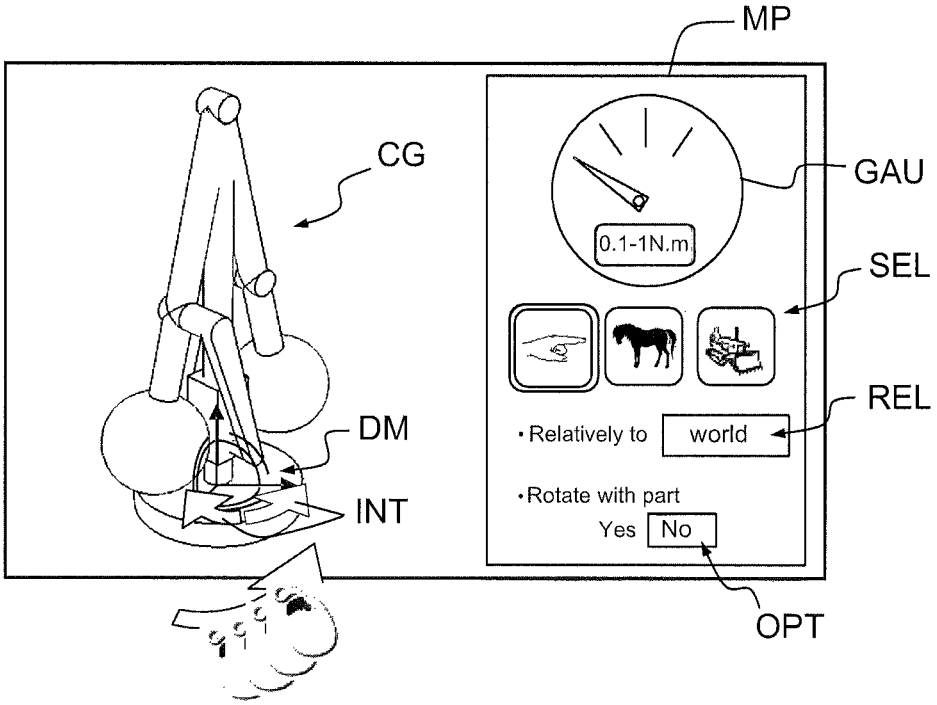

The displayed result is represented on FIG. 4, wherein rotation interactors INT appears, for example represented with two curved arrows, and, in the gauge GAU the minimum and maximum values are set according to the "strength" selector SEL indication, in this case the minimum and maximum values are 0.1 and 1 N.m of torque.

Thus, in a step 4, the user apply, in the present case, a torque with a mouse or a finger in case of touch screen.

In case of a translation, the speed drives the force, and in case of rotation, the acceleration drives the torque. A combination of acceleration and speed can also be used to drive translation and rotation.

Figure 5:
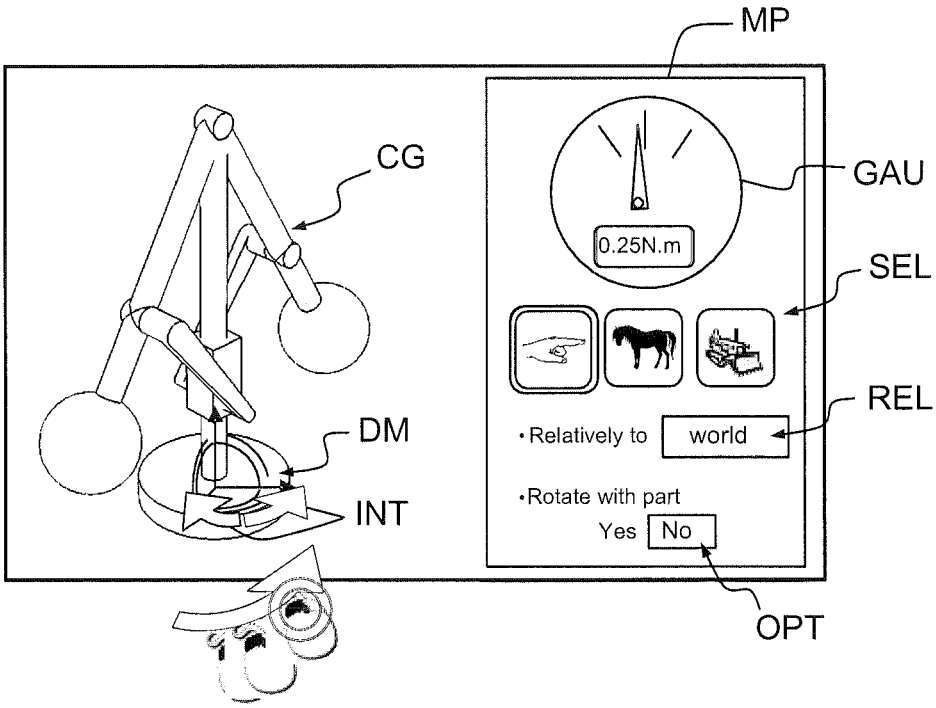

The displayed result is represented on FIG. 5, wherein the gauge GAU indicates the numerical value of said torque around a selected axis in N.m applied to the part of the assembly. The assembly moves accordingly.

Thus, in a step 5, the user can stop applying the torque by releasing a mouse button or finger from a touch screen.

Figure 6:
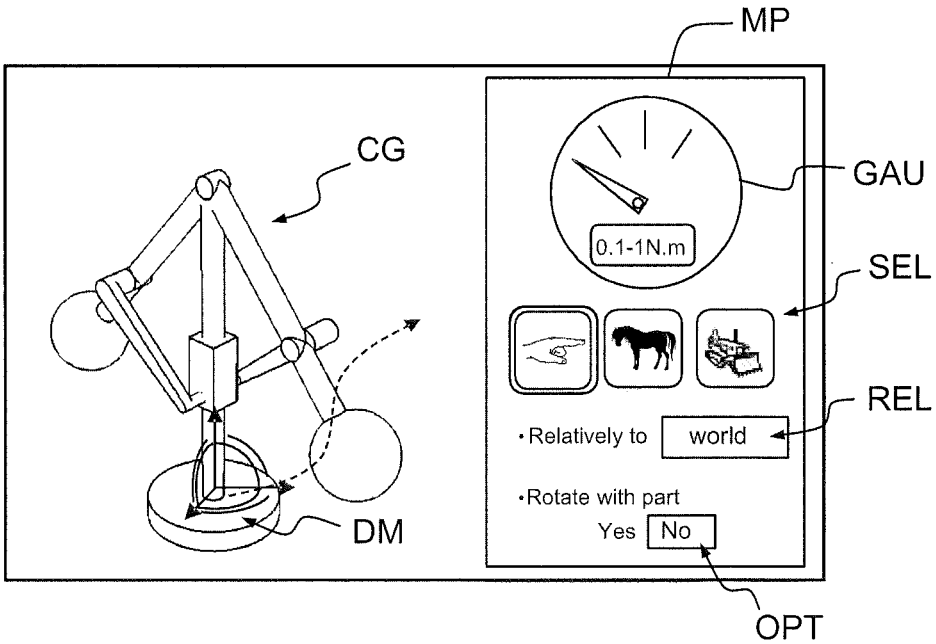

The displayed result is represented on FIG. 6, wherein the assembly rotation continues.

Thus, in a step 6, the user takes the dynamic manipulator DM away from the part of the assembly whose it was attached to.

Figure 7:
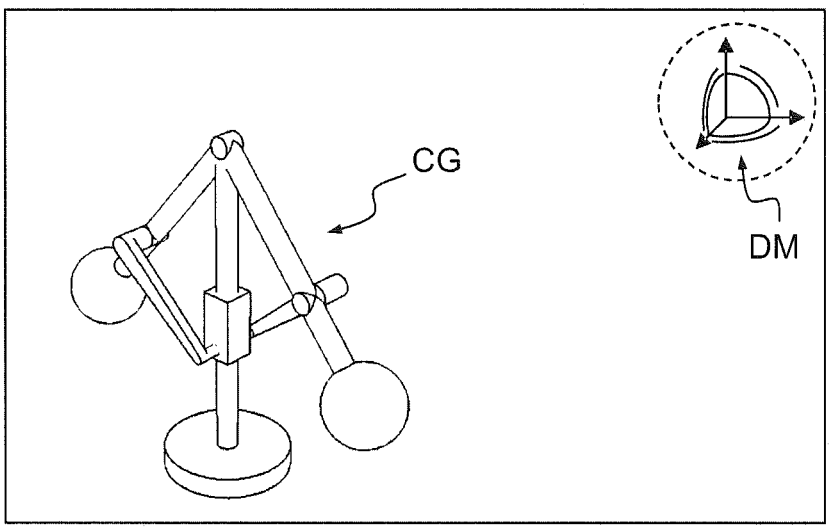

The displayed result is represented on FIG. 7, wherein the assembly rotation continues until the user decides to pause or stop the dynamic simulation. The manipulator panel MP is closed and the dynamic manipulator DM reappears ready for another manipulation until simulation is stopped.

Figure 8:
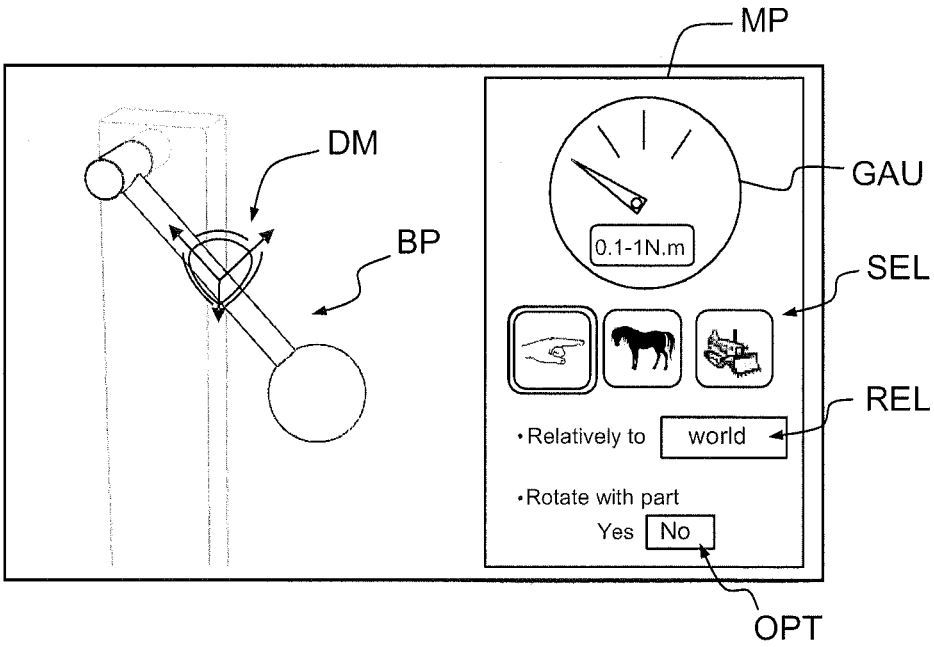
FIGS. 8 to 10 illustrate an example of dynamically manipulating an assembly of objects in a three-dimensional scene of a system of computer-aided design, in a case wherein a load is applied in a constant direction, according to an aspect of the invention.
Figure 9:
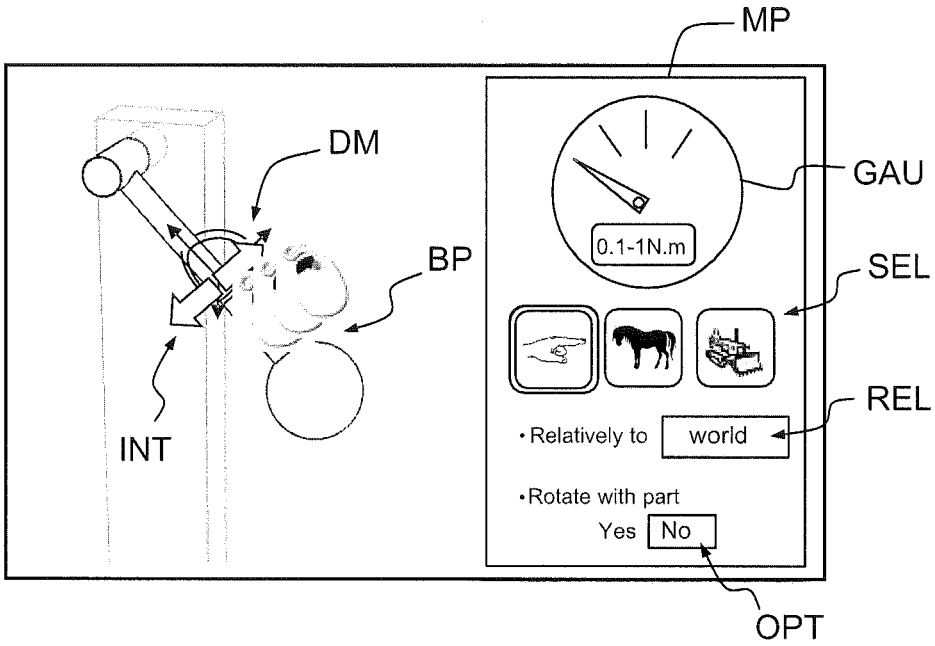
Figure 10:
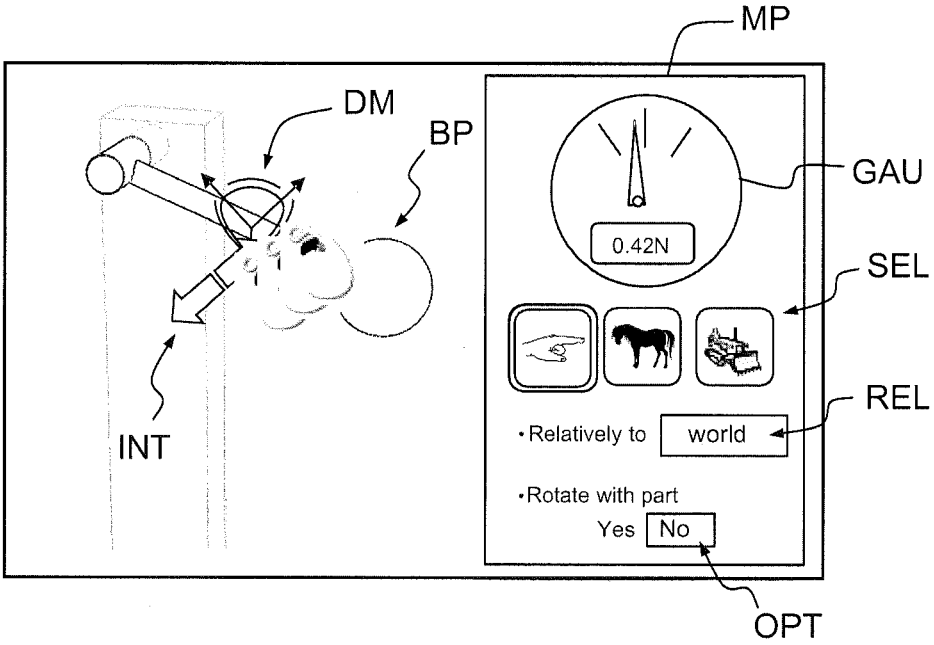

On FIGS. 8 to 10 is illustrated an example of dynamically manipulating an assembly of objects in a three-dimensional scene of a system of computer-aided design, in a case wherein a load is applied in a constant direction.

The method starts, like illustrated on FIG. 8, with a 3D model or assembly of objects stopped or immobile. On this example the assembly of objects or 3D model is an assembly comprising a balancing part or lever.

The dynamic simulation is already started and the dynamic manipulator DM is fixed on or attached to the lever. In a step 1, the user make sure that the option OPT of rotate with part of the manipulator panel MP is set to NO. Furthermore the selector SEL selects the hand icon, representative of a load comprised between 0.1 and 1 N.m.

Thus, the assembly is still balancing, and in a step 2, the user selects an axis of the dynamic manipulator DM.

On FIG. 9, translation interactors INT appear, for example represented with two straight arrows, and the user applies a force with a mouse or a finger in case of touch screen. The translation interactors INT don't move, otherwise the user would need to "run after the part" to apply a force. The dynamic manipulator DM follows the part at which it is linked and axis keep their orientation in the world reference frame, in other words axis don't rotate with said part. The balancing motion is going on.

Thus, like illustrated on FIG. 10, the dynamic manipulator DM follows the part to which it is linked and axis keep a constant orientation in the world reference frame, it doesn't rotate with the part, while the balancing motion is going on.

The user can apply a force in a given constant direction relatively to the world reference frame as if he pulls with an infinite rope.

On FIGS. 11 to 14 is illustrated an example of dynamically manipulating an assembly of objects in a three-dimensional scene of a system of computer-aided design, in a case wherein a load is applied in a direction parallel to a part of the assembly, according to an aspect of the invention.

Figure 11:
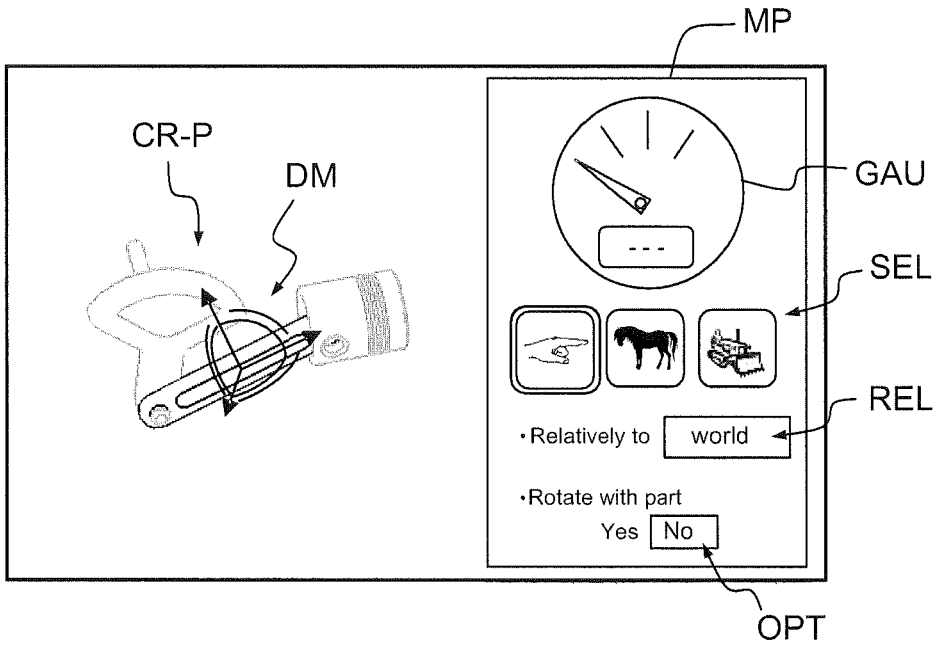
FIGS. 11 to 14 illustrate an example of dynamically manipulating an assembly of objects in a three-dimensional scene of a system of computer-aided design, in a case wherein a load is applied in a direction parallel to a part of the assembly, according to an aspect of the invention.
Figure 12:
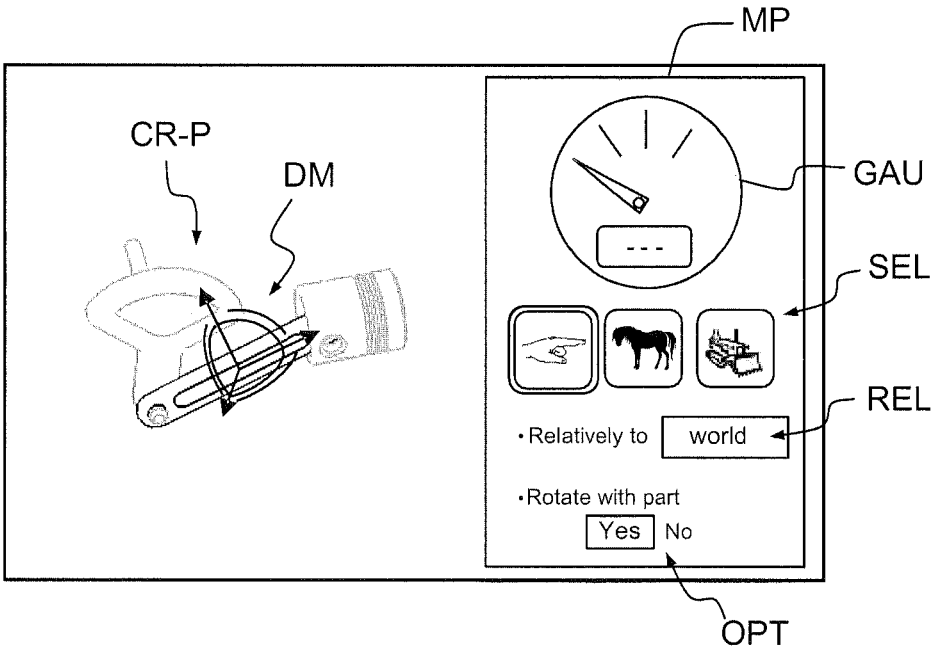

The method starts, like illustrated on FIG. 11, with a 3D model or assembly of objects stopped or immobile. On this example the assembly of objects or 3D model is a connecting rod-piston.

The dynamic simulation is started and the dynamic manipulator DM is attached to a part of the assembly. In a step 1, the user set the option OPT "rotate with part" to YES, like illustrated on FIG. 12, for the axis rotate with the part to which they are attached.

Figure 13:
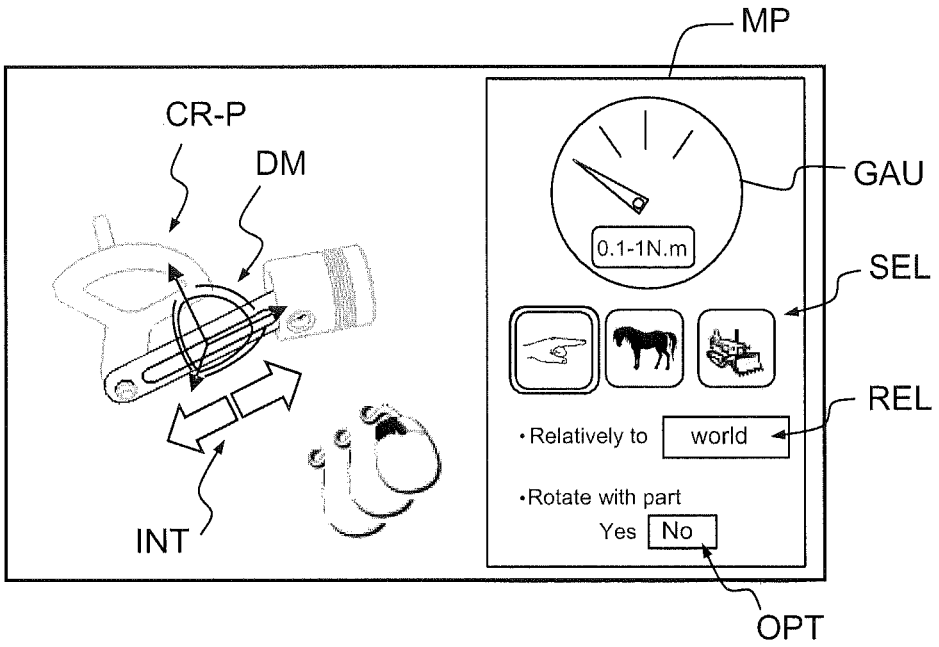

In a step 2, the user selects an axis for manipulation, and in a step 3, like represented on FIG. 13, the user can apply a force with a mouse or a finger in case of touch screen. Furthermore, the translation interactors INT appear.

Figure 14:
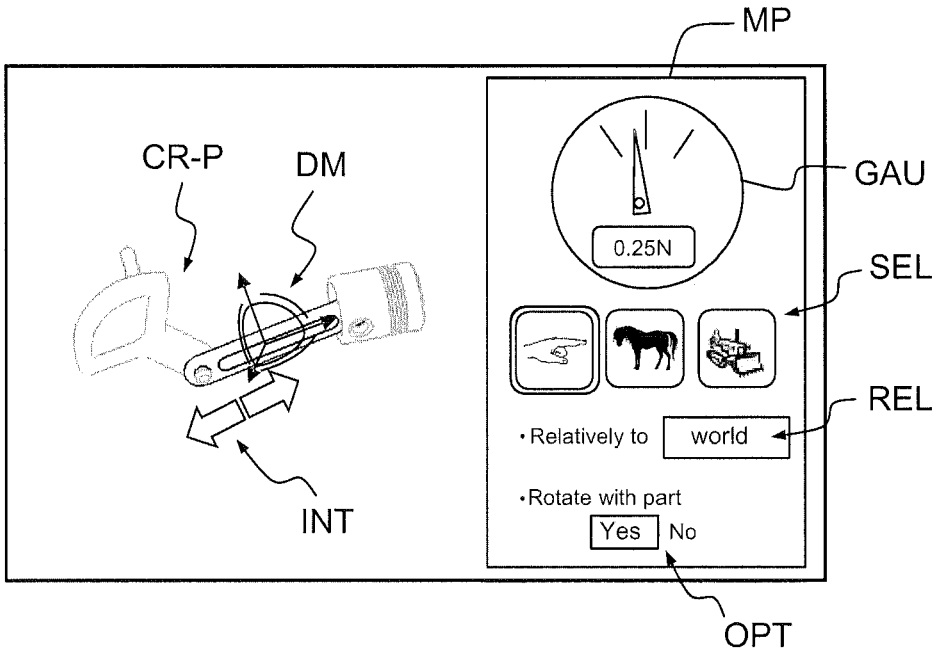

Then, the dynamic manipulator DM follows the part of the assembly to which it is linked, like illustrated on FIG. 14, with the axis keeping parallel to the part to which they linked, in other words the rod.

Thus, the user can apply a force on a part of the assembly following the part in the motion, like if he would use his hand to apply motion in real life.

On FIGS. 15 to 20 is illustrated an example of dynamically manipulating an assembly of objects, a centrifugal "fly ball" governor, in a three-dimensional scene of a system of computer-aided design, in a case wherein a load is applied in by numerical input to a part of the assembly.

Figure 15:
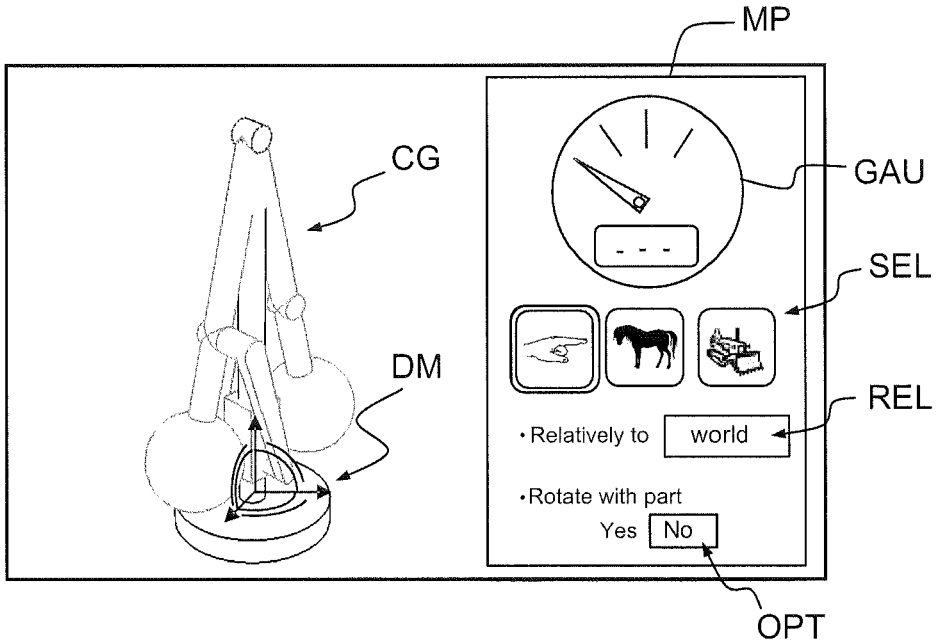
FIGS. 15 to 20 illustrate an example of dynamically manipulating an assembly of objects in a three-dimensional scene of a system of computer-aided design, in a case wherein a load is applied by numerical input to a part of the assembly, according to an aspect of the invention.

On FIG. 15, the method starts with a 3D model or assembly which is a centrifugal "fly ball" governor. The dynamic Manipulator DM is attached the mast base. The user selects one of the six possible manipulation among the three translations and the three rotations along the three axis.

Figure 16:
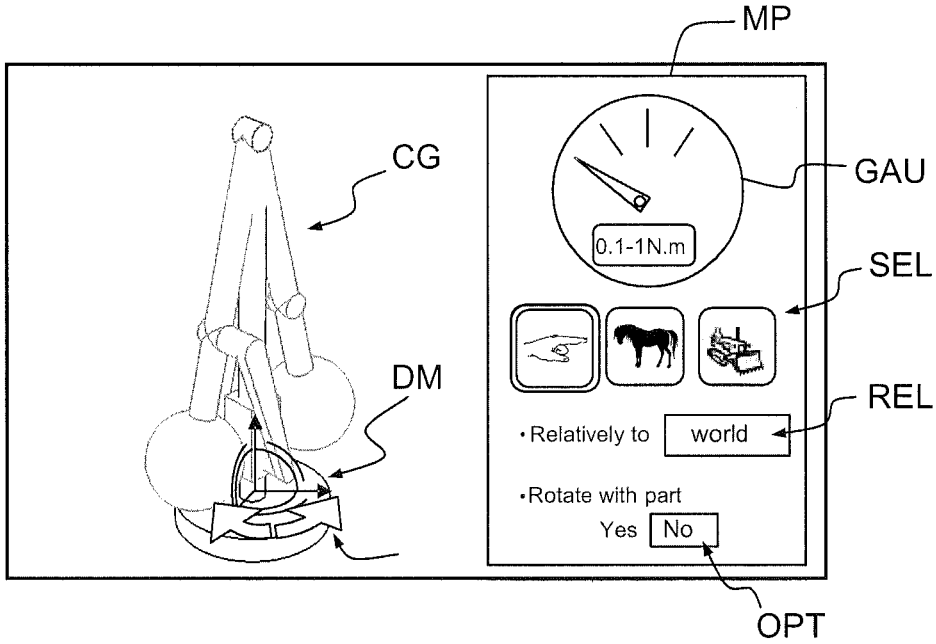

Thus rotation interactors INT appear, like illustrated on FIG. 16, and, in a step 2, the user enters a numerical value or turn the gauge GAU spindle with the mouse or a finger in case of touch screen.

Figure 17:
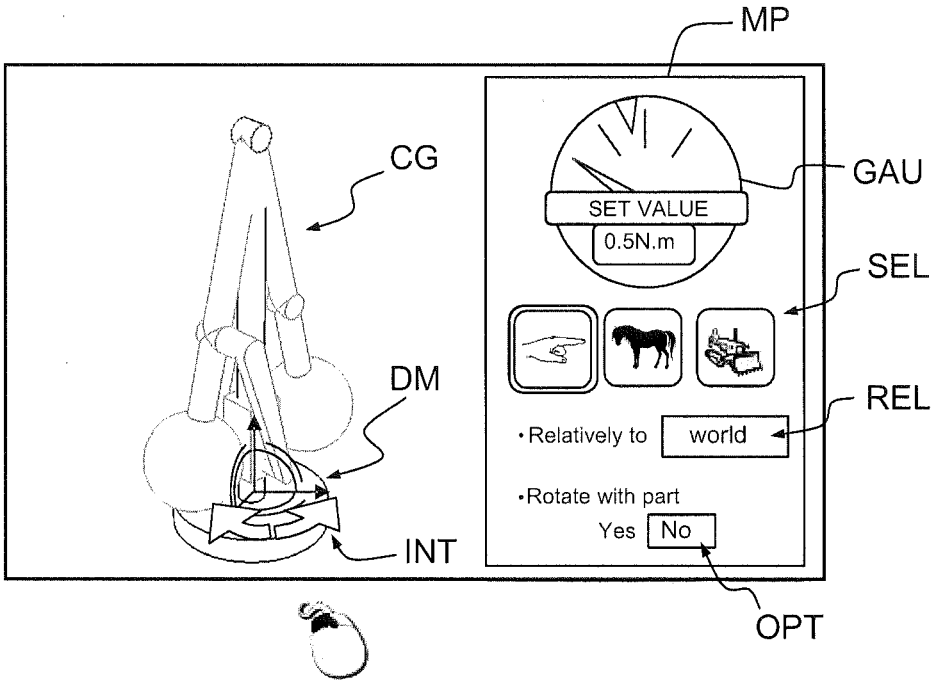

A message "set value" appears to indicate to the user that the load is driven by this value, like represented on FIG. 17, and the user can click on the rotation interactors INT (arrow) to apply the indicated load.

Figure 18:
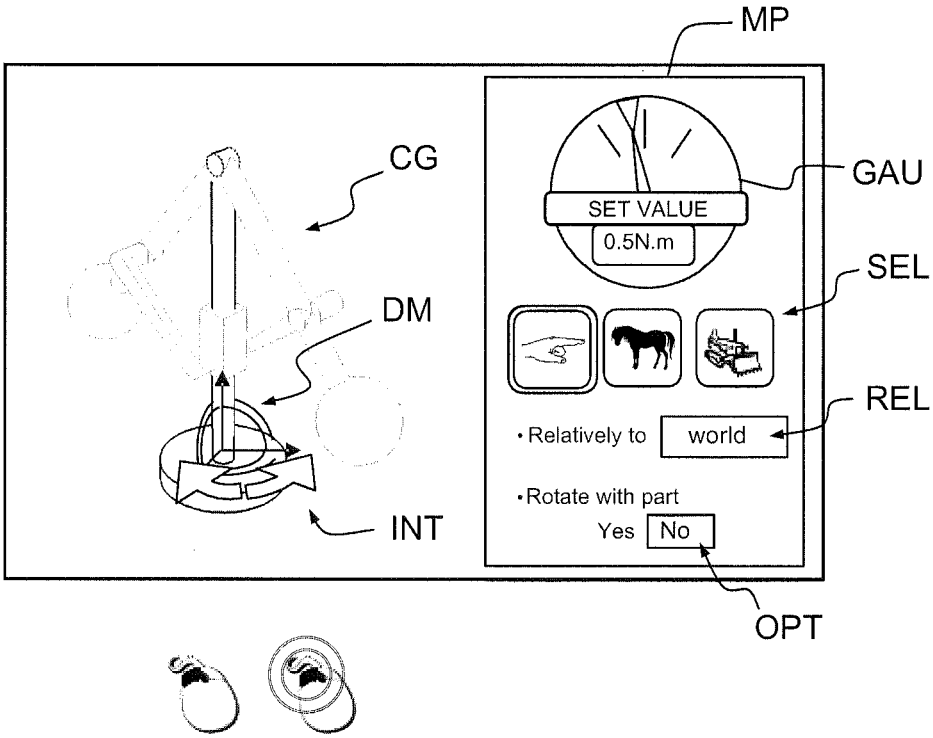

During motion, the spindle of the gauge GAU moves on the set value to indicate that this value is applied, like illustrated on FIG. 18. The assembly starts to rotate as the torque is applied. The rotation accelerates until the load is not applied anymore. Thus, in a step 4, the user can release the load by releasing mouse button or finger from the screen.

Figure 19:
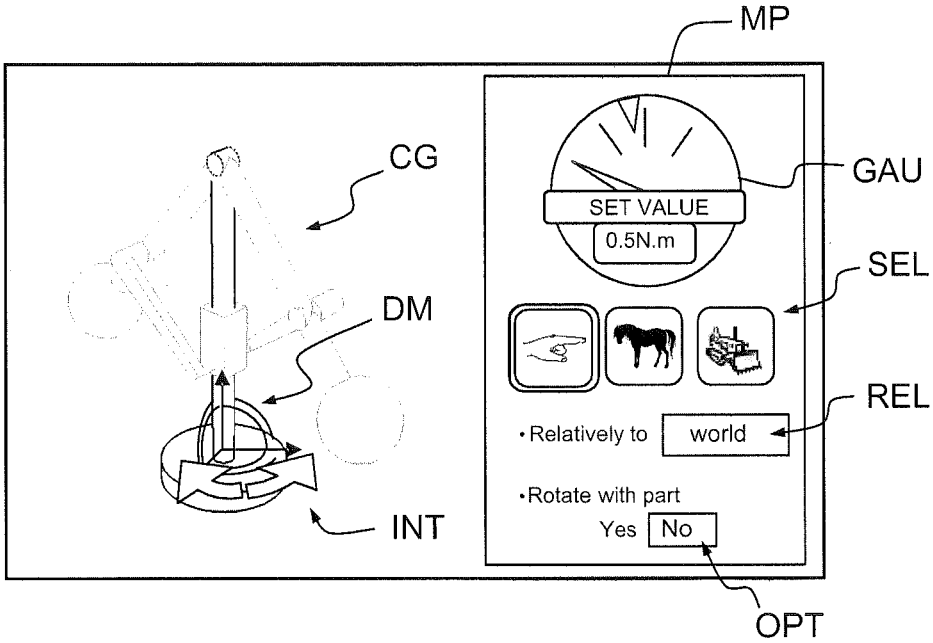
Figure 20:
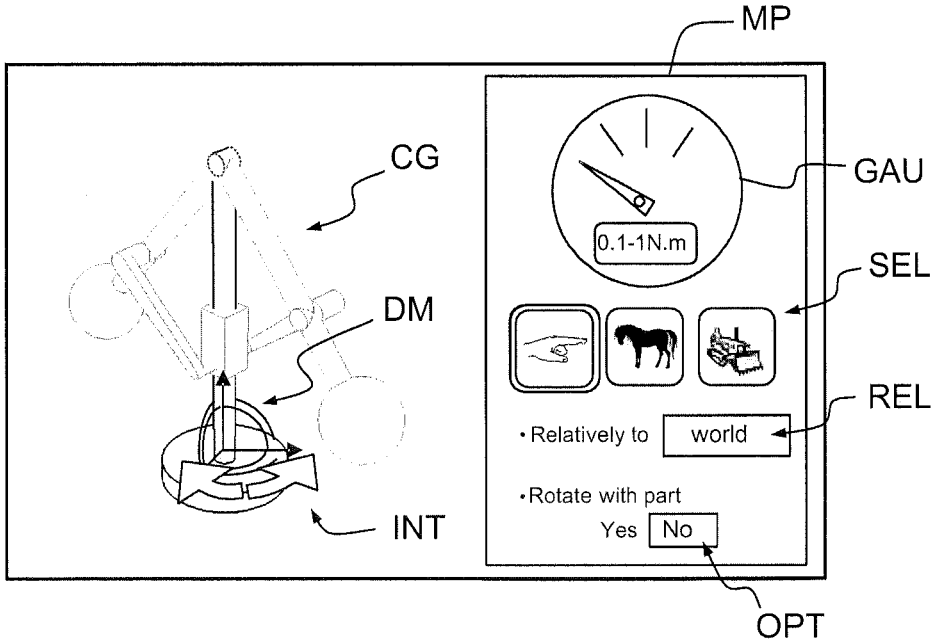

Thus like represented on FIG. 19, the gauge spindle indicates "0" as no more load is applied, and the message "set value" is still displayed.

In a step 5, the user can remove the set value by drag and drop of the mark of the gauge. The rotation continues like on FIG. 20. The following is like for basic cases.

Figure 21:
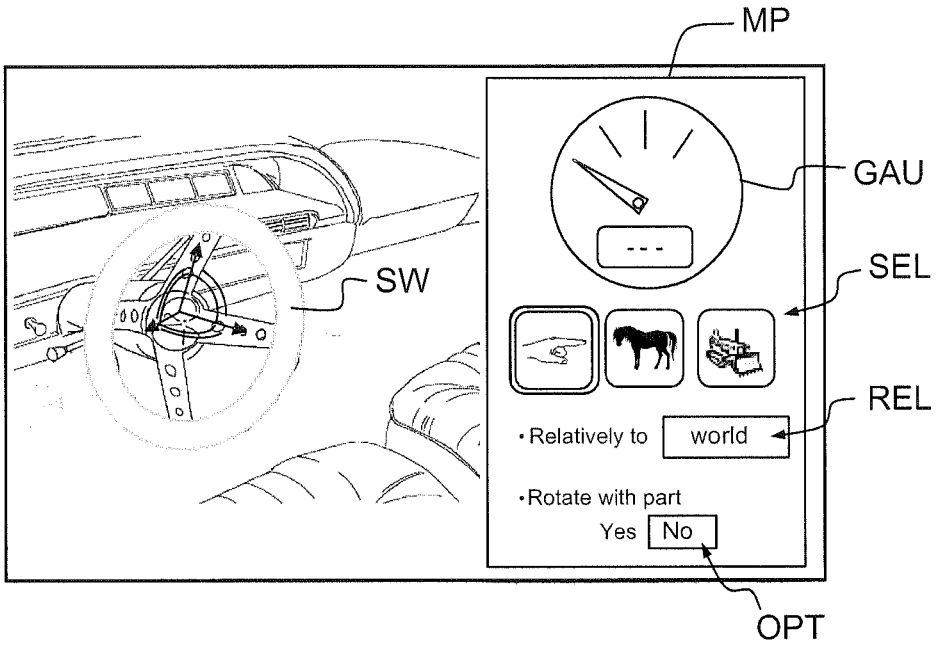
FIGS. 21 to 23 illustrate an example of dynamically manipulating an assembly of objects in a three-dimensional scene of a system of computer-aided design, in a case wherein a load is applied relatively to another part, according to an aspect of the invention.
Figure 22:
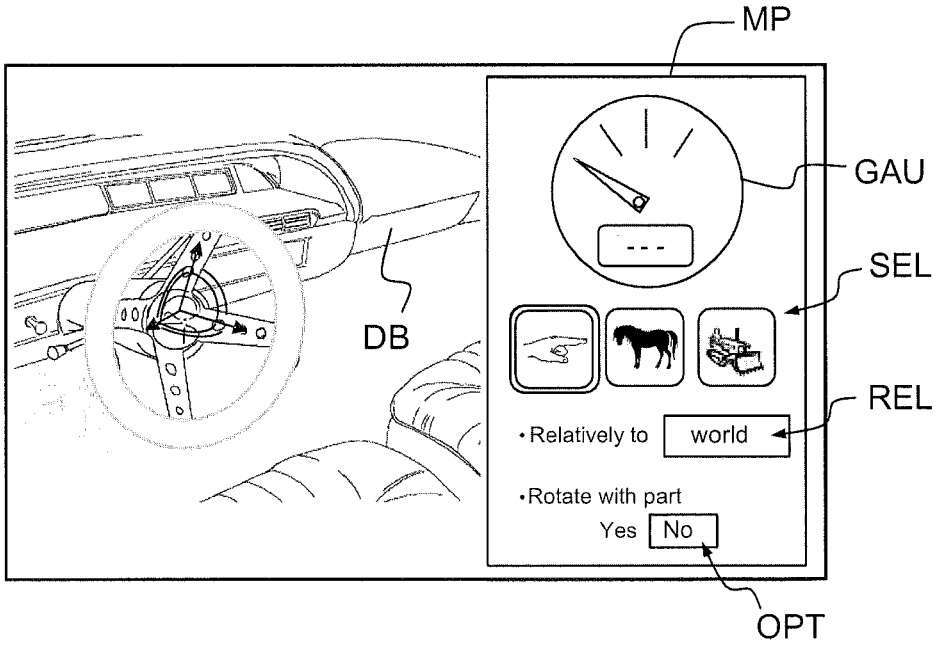

On FIGS. 21 to 22 is illustrated an example of dynamically manipulating an assembly of objects in a three-dimensional scene of a system of computer-aided design, in a case wherein a load is applied relatively to another part.

On FIG. 21 a dynamic simulation on a steering wheel SW of a car on which the dynamic manipulator DM is attached. In a step 1, the user clicks in the field REL "relatively to" and in a step 2, like illustrated on FIG. 22, selects a part or element of the assembly, in this case the dashboard DB.

Figure 23:
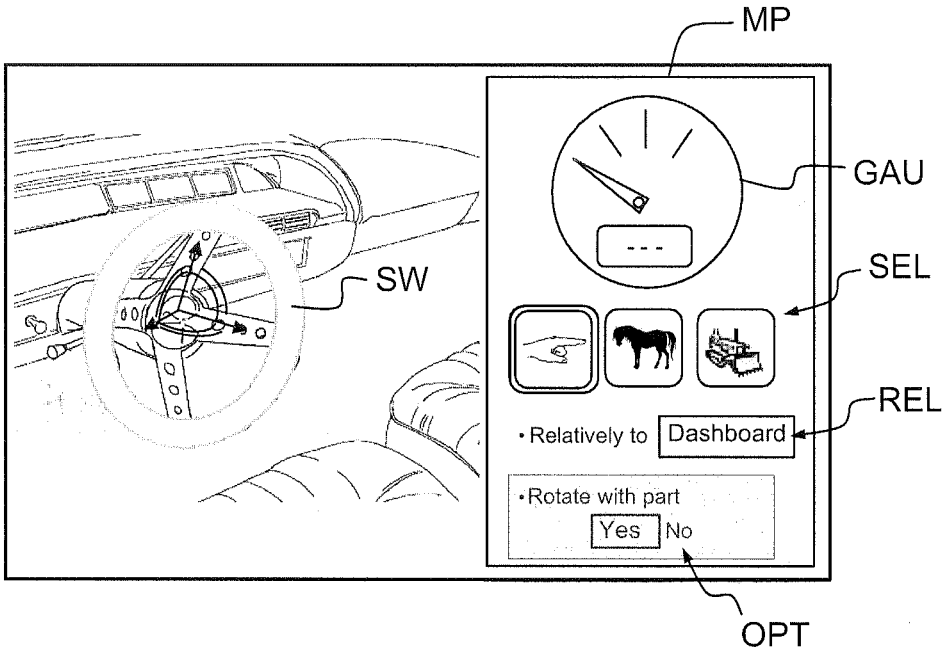

Thus, like illustrated on FIG. 23, the user can apply a load as if he sits in the car, relatively to the dashboard DB.

Figure 24:
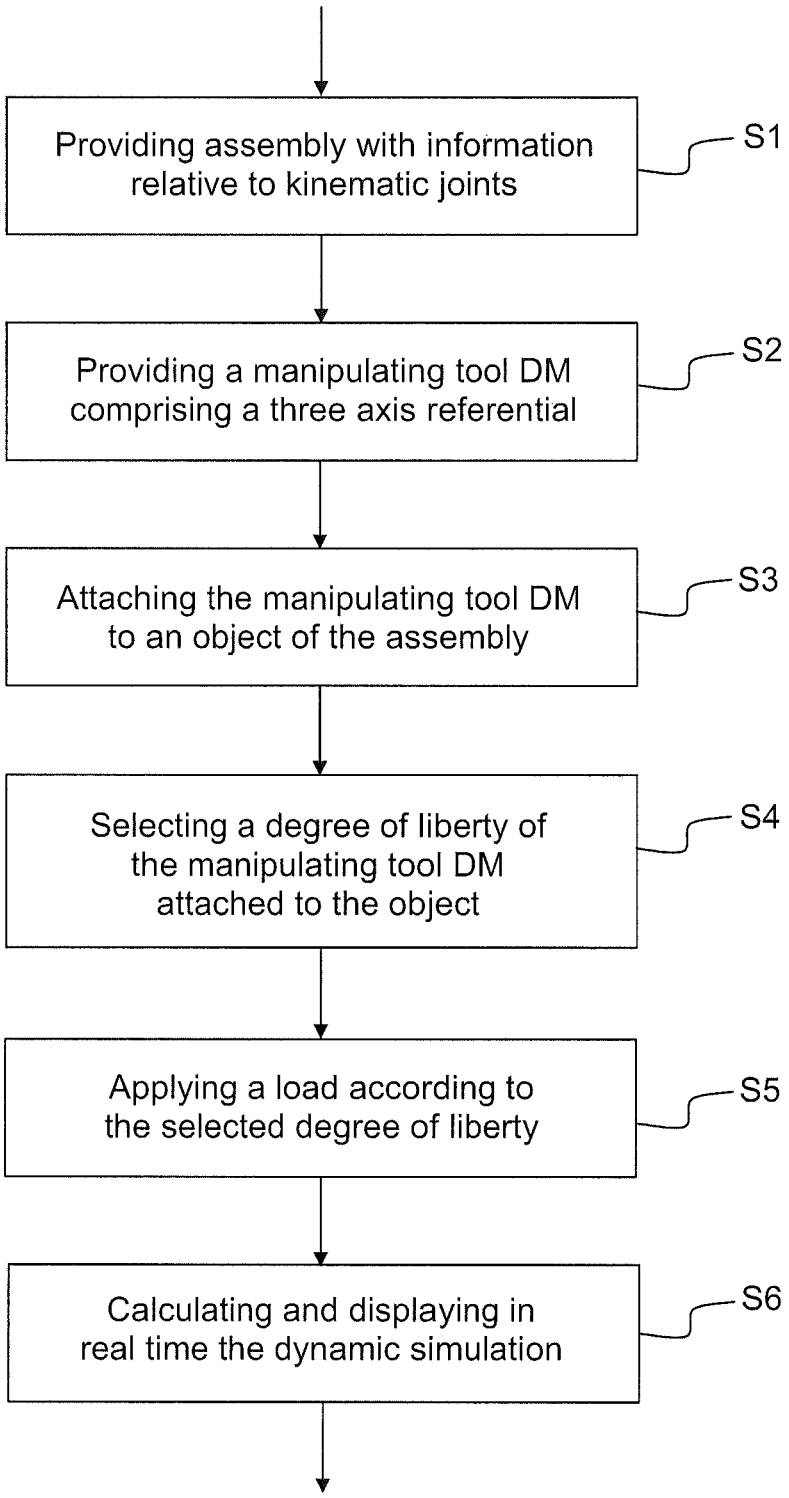
FIGS. 24 and 25 illustrate a method according to an aspect of the invention.

To summarize the above, the method according to an aspect of the invention comprises the step illustrated on FIG. 24.

In a first step S1, the method provides the assembly of objects with information relative to kinematic joints linking objects of the assembly.

Then, in a second step S2, the method provides a dynamic manipulating tool DM embedded in the scene, comprising a referential with three-axis allowing for each axis a degree of freedom in translation and a degree of freedom in rotation, and in a third step S3 the method attaches said dynamic manipulating tool DM to an object of the assembly.

Thus, in a fourth step S4, the method selects a degree of freedom of the dynamic manipulating tool DM attached to the object of the assembly, in a fifth step S5, the method applies a load according to said selected degree of freedom, and in a sixth step S6 calculates in real-time and displays in real-time the result of a dynamic simulation of said load applying.

Figure 25:
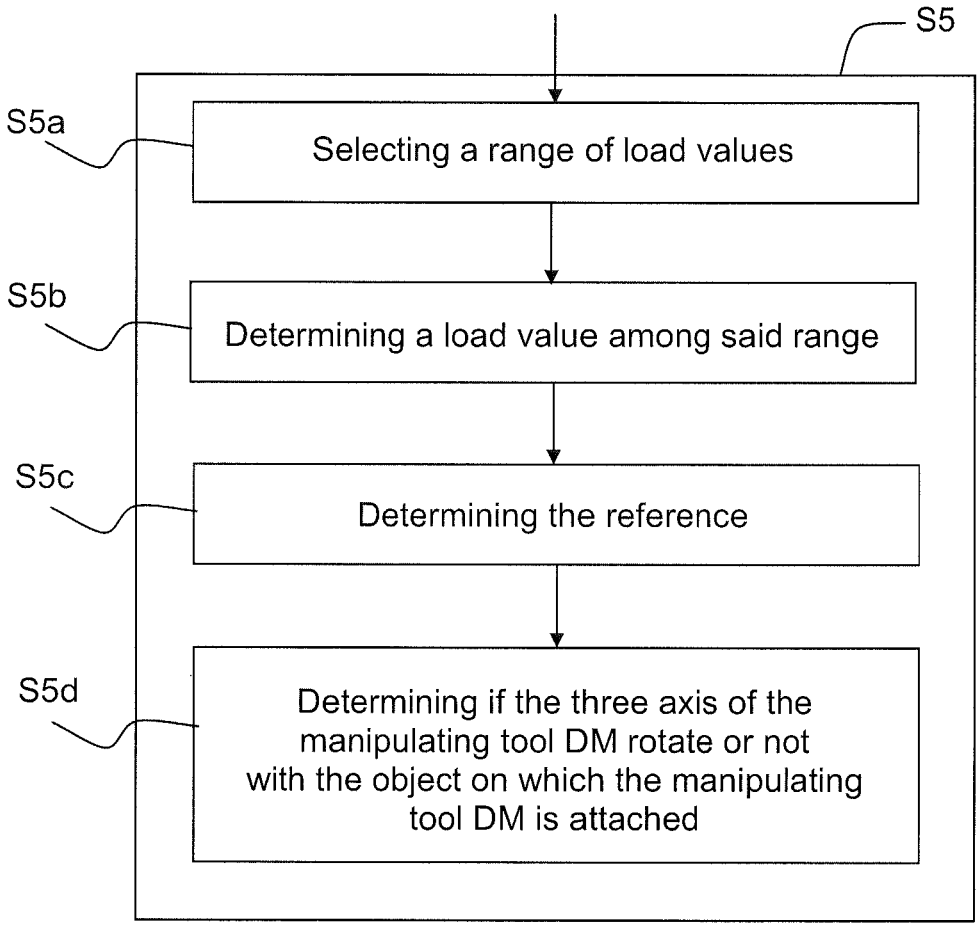

For example, like illustrated on FIG. 25, the fifth step S5 can comprise a first sub-step S5a of selecting a range of load values, and a second sub-step S5b of determining a load value among said range.

Furthermore, the fifth step S5 can comprise an optional third sub-step S5c of determining a referential from which the load is applied, and an optional fourth sub-step S5d of determining if the three-axis of the dynamic manipulating tool rotate or not with the object on which the dynamic manipulating tool is attached.

Thus the present invention provides a computer-implemented method and a system for dynamically manipulating an assembly of objects in a three-dimensional scene of a system of computer-aided design, taking into account dynamically, or, in other words in real-time the physical laws of dynamic forces, like gravity and load (force, torque).

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for dynamically manipulating an assembly of objects forming a product in a three-dimensional scene of a system of computer-aided design enabling design of the product, the method comprising:

providing the assembly of objects with information relative to kinematic joints linking objects of the assembly;

providing a dynamic manipulating tool embedded in the scene, comprising a referential with three axes allowing for each axis a degree of freedom in translation and a degree of freedom in rotation;

attaching said dynamic manipulating tool to one object of the assembly;

selecting a degree of freedom of the dynamic manipulating tool attached to the one object of the assembly;

applying a load [according to said selected degree of freedom] based on a performed movement [of] *associated with* the dynamic manipulating tool, the performed movement [of] *associated with* the [dynamic manipulating] tool being converted into a load value, wherein said conversion takes into account a speed for a movement of translation according to an axis or an acceleration for a movement of rotation according to an axis or a combination of acceleration and speed to drive both rotation and translation; and calculating and displaying in real-time physical effects of a dynamic simulation of said load applying to the assembly of objects, in furtherance of designing the product;

wherein said applying the load is performed during the dynamic simulation based on real-time user interactions with the dynamic manipulating tool.

[2. The method according to claim 1, wherein said applying a load according to said selected degree of freedom comprises:

selecting a range of load values, the range of load values being an ordered set of load values with a minimum and a maximum load value; and determining a load value among said range of load values.]

[3. The method according to claim 2, wherein said applying a load according to said selected degree of freedom further comprises determining a referential in which the load is applied.]

[4. The method according to claim 3, wherein said applying a load according to said selected degree of freedom further comprises determining if the three axes of the dynamic manipulating tool rotates or not with the one object on which the dynamic manipulating tool is attached.]

[5. The method according to claim 1, wherein the movement of the dynamic manipulating tool is performed with a mouse with a pressed button or with a contact of a finger on a screen of displaying.]

6. The method according to claim [5] *1*, wherein [said] *the performed* movement *is* with a mouse or a finger [is] applied at a distance from the dynamic manipulating tool.

[7. The method according to claim 1, wherein said load is a force or a torque.]

8. A computer-aided design system comprising[:]:

a computer system; and a non-transitory computer-readable medium having computer-executable instructions that cause the computer system to dynamically manipulate an assembly of objects forming a product in a three-dimensional scene of a computer-aided design enabling design of the product, said instructions including causing the computer system to:

provide the assembly of objects with information relative to kinematic joints linking objects of the assembly;

provide a dynamic manipulating tool embedded in the scene, comprising a referential with three axes allowing for each axis a degree of freedom in translation and a degree of freedom in rotation;

attach said dynamic manipulating tool to one object of the assembly;

select a degree of freedom of the dynamic manipulating tool attached to the one object of the assembly;

apply a load [according to said selected degree of freedom] based on a performed movement [of] *associated with* the dynamic manipulating tool, the performed movement [of] *associated with* the tool being converted into a load value, wherein said conversion takes into account a speed for a movement of translation according to an axis or an acceleration for a movement of rotation according to an axis or a combination of acceleration and speed to drive both rotation and translation; and calculate and display in real-time physical effects of a dynamic simulation of said load applying to the assembly of objects, in furtherance of designing the product;

wherein said instructions cause the computer system to apply the load during the dynamic simulation based on real-time user interactions with the dynamic manipulating tool.

[9. The computer-aided design system as claimed in claim 8, wherein the instructions cause the computer system to apply the load according to the selected degree of freedom by:

selecting a range of load values, the range of load values being an ordered set of load values with a minimum and a maximum load value, and determining a load value among said range of load values.]

[10. The computer-aided design system as claimed in claim 9, wherein the instructions cause the computer system to apply the load further by:

determining a reference in which the load is applied; and determining if the three axes of the dynamic manipulating tool rotates or not with the one object on which the dynamic manipulating tool is attached.]

[11. The computer-aided design system as claimed in claim 8 wherein the movement of the dynamic manipulating tool is performed with a mouse with a pressed button or with a contact of a finger on a screen of displaying; and wherein said movement with a mouse or a finger is applied at a distance of the dynamic manipulating tool.]

[12. The computer-aided design system as claimed in claim 8 wherein said load is a force or a torque.]

13. A computer program product comprising:

a non-transitory computer readable medium, for dynamically manipulating an assembly of objects forming a product in a three-dimensional scene of a system of computer-aided design enabling design of the product; and

[code means] *computer-executable instructions* stored on the computer readable medium and causing the system to take the steps of:

providing the assembly of objects with information relative to kinematic joints linking objects of the assembly;

providing a dynamic manipulating tool embedded in the scene, comprising a referential with three axes allowing for each axis a degree of freedom in translation and a degree of freedom in rotation;

attaching said dynamic manipulating tool to one object of the assembly;

selecting a degree of freedom of the dynamic manipulating tool attached to the one object of the assembly;

applying a load [according to said selected degree of freedom] based on a performed movement [of] *associated with* the dynamic manipulating tool, the performed movement [of] *associated with* the tool being converted into a load value, wherein said conversion takes into account a speed for a movement of translation according to an axis or an acceleration for a movement of rotation according to an axis or a combination of acceleration and speed to drive both rotation and translation; and calculating and displaying in real-time physical effects of a dynamic simulation of said load applying to the assembly of objects, in furtherance of designing the product;

wherein said applying the load is performed during the dynamic simulation based on real-time user interactions with the dynamic manipulating tool.

[14. A computer apparatus comprising:

means for dynamically manipulating an assembly of objects forming a product in a three-dimensional scene of a system of computer-aided design enabling further development and design of the product;

said means including computer means for implementing the steps of:

providing the assembly of objects with information relative to kinematic joints linking objects of the assembly;

providing a dynamic manipulating tool embedded in the scene, comprising a referential with three axes allowing for each axis a degree of freedom in translation and a degree of freedom in rotation;

attaching said dynamic manipulating tool to one object of the assembly;

selecting a degree of freedom of the dynamic manipulating tool attached to the one object of the assembly;

applying a load according to said selected degree of freedom based on a performed movement of the dynamic manipulating tool, the performed movement of the tool being converted into a load value, wherein said conversion takes into account a speed for a movement of translation according to an axis or an acceleration for a movement of rotation according to an axis or a combination of acceleration and speed to drive both rotation and translation; and calculating and displaying in real-time physical effects of a dynamic simulation of said load applying to the assembly of objects, in furtherance of designing the product;

wherein said applying the load is performed during the dynamic simulation based on real-time user interactions with the dynamic manipulating tool.]

[15. A computer apparatus as claimed in claim 14 wherein said load is a force or a torque.]

* * * * *